United States Patent
Cousin et al.

(10) Patent No.: US 10,371,774 B2
(45) Date of Patent: Aug. 6, 2019

(54) METHOD FOR TWO FIELD NUCLEAR MAGNETIC RESONANCE MEASUREMENTS

(71) Applicants: Bruker BioSpin S.A.S., Wissembourg (FR); Ecole normale supérieure, Paris (FR); Centre National de la Recherche Scientifique, Paris (FR); Université Pierre et Marie Curie (Paris 6), Paris (FR)

(72) Inventors: Samuel Cousin, Auxerre (FR); Cyril Charlier, Rockville, MD (US); Fabien Ferrage, Auxerre (FR); Jean-Max Tyburn, Auxerre (FR); Thorsten Marquardsen, Auxerre (FR)

(73) Assignees: Bruker S.A.S, Wissembourg (FR); Ecole normale supérieur, Paris (FR); Centre National de la Recherche Scientifique, Paris (FR); Université Pierre et Marie Curie (Paris 6), Paris (FR)

( * ) Notice: Subject to any disclaimer, the term of this patent is extended or adjusted under 35 U.S.C. 154(b) by 571 days.

(21) Appl. No.: 15/096,287

(22) Filed: Apr. 12, 2016

(65) Prior Publication Data
US 2016/0299204 A1 Oct. 13, 2016

(30) Foreign Application Priority Data
Apr. 13, 2015 (EP) .................... 15290102

(51) Int. Cl.
*G01R 33/46* (2006.01)
*G01R 33/387* (2006.01)
(Continued)

(52) U.S. Cl.
CPC ....... *G01R 33/4616* (2013.01); *G01R 33/387* (2013.01); *G01R 33/445* (2013.01);
(Continued)

(58) Field of Classification Search
None
See application file for complete search history.

(56) References Cited

U.S. PATENT DOCUMENTS 7,492,154 B2 * 2/2009 Lucas ................. G01R 33/282
324/300
7,639,007 B2 * 12/2009 Hutton ................. G01R 33/30
324/307

(Continued)

OTHER PUBLICATIONS

R. Kreis et al., "Time-Domain Zero-Field . . . ", Chemical Physices Letters, vol. 118, No. 2, Jul. 19, 1985.

(Continued)

*Primary Examiner* — Jermele M Hollington
(74) *Attorney, Agent, or Firm* — Paul Vincent (57) ABSTRACT

A method for carrying out two-field nuclear magnetic resonance (=2FNMR) measurements involves preparing a sample (9a) in a first working volume (5) of a highly homogeneous magnetic field with a first field strength; transferring the sample (9a) to a second working volume (7) with a magnetic field having lower homogeneity and having a second field strength, wherein the first field strength is at least 2 Tesla larger than the second field strength; manipulating the sample (9a) at the second working volume (7) by applying a sequence of radio-frequency (=RF) and/or field gradient pulses; transferring the sample (9a) back to the first working volume (5); and detecting an NMR signal of the sample (9a) in the first working volume (5). The method allows for NMR experiments with which more and/or improved quality information about an investigated sample can be obtained.

19 Claims, 8 Drawing Sheets (51) Int. Cl.
    *G01R 33/44*     (2006.01)
    *G01R 33/30*     (2006.01)
    *G01R 33/36*     (2006.01)

(52) U.S. Cl.
    CPC ........ *G01R 33/4633* (2013.01); *G01R 33/307* (2013.01); *G01R 33/3635* (2013.01)

(56) References Cited

U.S. PATENT DOCUMENTS

| | | | |
|---|---|---|---|
| 7,649,355 B2 * | 1/2010 | Strange | G01R 33/28 324/307 |
| 8,154,292 B2 | 4/2012 | Bovier | |
| 2008/0290869 A1 * | 11/2008 | Hutton | G01R 33/30 324/318 |
| 2009/0085562 A1 * | 4/2009 | Strange | G01R 33/28 324/307 |

OTHER PUBLICATIONS

A. Bielecki et al., "Zero-field NMR . . . ", Rev. Sci. Instrum. 57 (3), Mar. 1986.

\* cited by examiner

METHOD FOR TWO FIELD NUCLEAR MAGNETIC RESONANCE MEASUREMENTS

This application claims Paris convention priority from EP 15 290 102.1, filed Apr. 13, 2015, the entire disclosure of which is hereby incorporated by reference.

BACKGROUND OF THE INVENTION

The invention relates to a method for carrying out nuclear magnetic resonance measurements on a sample using a first working volume and second working volume with different magnetic field strengths.

Such a method is known from U.S. Pat. No. 8,154,292 B2.

Nuclear magnetic resonance (=NMR) spectroscopy is a powerful tool in instrumental chemical analysis. In NMR experiments, a sample is exposed to a strong static magnetic field which interacts with spins of nuclei contained in the sample. Radio frequency (=RF) pulses are sent into the sample for manipulating the spins, and the sample's reaction, i.e. RF signals (also called NMR signals) are measured. The sample's reaction depends on the environment of the nuclei in the sample, in particular bonding electrons. Accordingly, information about the chemical structure of the sample can be obtained by analyzing the RF signals measured.

In general, stronger static magnetic fields lead to stronger NMR signals and higher resolution, what improves the quality of information obtained from the sample. However, providing very strong magnetic fields is complex and expensive. Moreover, for some types of experiments, stronger magnetic fields do not offer improvements, in particular when chemical shift anisotropy becomes relevant, e.g. in carbonyl 13C relaxation. Further, in experiments including chemical shift evolution delays, there are optimum magnetic fields for some nuclei which are already accessible, so further increase of magnetic field strength will not improve the quality of information obtained from the experiment here.

In order to improve NMR signal strength, it is known to apply hyperpolarization to the nuclei to be investigated. In U.S. Pat. No. 8,154,292 B2, a DNP-NMR apparatus is disclosed, which comprises a first working volume at a center of a superconducting magnet configuration, equipped with an NMR probe, and a second working volume at a distance form the first working volume and with magnetic field strength lower than at the first working volume, equipped with a device for DNP (dynamic nuclear polarization) excitation. Both working volumes are located in the room temperature bore of a cryostat containing the superconducting magnet configuration. A transfer mechanism allows movement of a sample between the working volumes. This apparatus allows doing the DNP polarization at a dedicated location, independent of the actual NMR experiment.

R. Kreis at al., Chem. Phys. Lett. Vol. 118, No. 2, Jul. 19, 1985, pages 120-124, describe a time domain zero-field magnetic resonance experiment with field pulse excitation. A sample is polarized in high magnetic field, then rapidly transported to zero field by a gas pressure system. At zero field, RF pulses are applied to the sample. The sample is then transferred back to high field, and NMR detection is done by applying an echo sequence using composite π/2 pulses. This experiment is useful if electrical fields alone, which cause different energy levels for different nuclear spins, shall be studied, for example electrical quadrupole fields.

It is the object of the invention to provide a method for doing NMR experiments with which more and/or improved quality information about an investigated sample can be obtained.

SUMMARY OF THE INVENTION

This object is achieved, in accordance with the invention, by a method for carrying out two-field nuclear magnetic resonance (=2FNMR) measurements on a sample, the method comprising the steps of:
a) preparing the sample during a preparation period in a first working volume of a magnetic field with a first field strength having a homogeneity better than 0.01 ppm;
b) transferring during a first transfer period the sample to a second working volume with a magnetic field having a homogeneity of 100 ppm or better, in particular in the range between 2 ppm and 100 ppm, and having a second field strength,
wherein the second field strength is 0.05 Tesla or larger, in particular 0.1 Tesla or larger, and wherein the first field strength is at least 2 Tesla larger than the second field strength;
c) manipulating during a manipulation period the sample at the second working volume by applying a sequence of radio-frequency (=RF) and/or field gradient pulses, which is insensitive to or minimizes the effects of an inhomogeneity of the magnetic field in the second working volume;
d) transferring the sample back to the first working volume during a second transfer period;
e) detecting an NMR signal of the sample in the first working volume.

The inventive method allows to exploit interaction of nuclear spins with magnetic fields of two different strengths, by means of which more spectroscopic information about the sample becomes accessible.

In the course of the inventive method for carrying out Two-Field Nuclear Magnetic Resonance (2FNMR) experiments, nuclear spins may be exposed to and manipulated by means of RF pulses at two different magnetic field strengths. This allows obtaining additional spectroscopic information about the sample, in particular dynamic information or an additional measurement dimension which may be used to increase resolution, in particular to identify maxima in spectra more reliably.

At the first working volume, generally equipped with a first NMR probe, a first field strength ("high field") with a high homogeneity is present, allowing in particular a strong initial polarization and a signal detection with high resolution and high sensitivity. Further, nuclear spin manipulations may be done at the first working volume.

At the second working volume, generally equipped with a second NMR probe, a second field strength ("low field") with an at least fairly good homogeneity is present, which also allows nuclear spin manipulations, in particular band-selective manipulations of spins. In accordance with the invention, the RF and/or field gradient pulse sequence applied in step c) is chosen such that it is insensitive to or minimizes the effects of the (remaining) inhomogeneity of the magnetic field at the second working volume. Accordingly, high resolution NMR experiments can be performed wherein only one working volume of high homogeneity has to be provided. Note that for cancelling or minimizing the effects of a poorer homogeneity of the magnetic field in the second working volume (as compared to the magnetic field in the first working volume), the properties of zero-quantum coherences may be used (see below).

For numerous nuclear spin systems, the coupling properties and/or the relaxation times depend on the magnetic field strength present. Accordingly, since there are two different field strengths available in the inventive method, the method allows to perform experiments which make use of the different coupling properties and/or relaxation times in the same single measurement. This provides additional information about the sample in spectroscopy applications.

In particular, dynamic information (movement information) about nuclei in the sample or molecules containing said nuclei may be obtained.

In agreement with the invention, an additional dimension of NMR measurement of the sample becomes available. This additional dimension is based on a different second field strength and therefore on a different physical behavior, as compared to the physical behavior at the first field strength. In other words, the development of a spin system in the sample is different at the first and second field strength.

A typical multidimensional NMR experiment, in accordance with the invention, involves investigating at least one time parameter at low field, and at least one time parameter at high field. Typically, one time parameter at high field is fully varied in each single measurement, whereas one time parameter at low field is varied only from one single measurement to a next one.

The invention is particularly suitable for observing chemical shifts at two different fields in one experiment or a set of single measurements, respectively (with the chemical shifts representing the two dimensions of a measured 2-dimensional spectrum), in particular with the two chemical shifts belonging to different nuclei. The NMR active nuclei may be part of the same molecule (to investigate spin-spin coupling), or alternatively of different molecules (to investigate dipolar coupling).

It should also be mentioned that at lower field strengths, the split-up of energy levels of nuclear spins is less pronounced, what simplifies spin manipulations at lower field. Accordingly, the inventive method may in particular be used to manipulate (and let develop) spins at low field, and to observe the NMR signal at high field (e.g. an FID signal).

A first and second NMR probe at the first and second working volume, respectively, are tuned to one (or preferably several) NMR resonance lines of nuclei of the sample, such as the frequencies of 1H, 2H, 13C or 15N at the field strength of their respective working volume. The first NMR probe is for NMR signal excitation as well as NMR signal detection. The second NMR probe is used for NMR signal excitation, and may also be used for NMR signal detection. It should be noted that the interaction of the two magnetic fields of different strengths with the nuclei may include relaxation processes and/or induced coherent processes in each case.

A magnet configuration for producing a magnetic field at the first working volume typically comprises at least one superconducting magnet coil in a cryostat. The required homogeneity of the respective working volumes is present at least in the space taken by the sample. When the stray field of the magnet configuration is used to provide the second working volume with the second field strength, the design of an apparatus for carrying out the inventive method is particularly simple and cost-efficient. In accordance with the invention, the first and second field strength differ at least by 2 Tesla, preferably at least 4 Tesla, and may be chosen to be different at least by a factor of 3, in order to establish a significantly different behavior of spins at the two field strengths.

Particularly preferred is a variant of the inventive method wherein in step c), the RF and/or field gradient pulse sequence is insensitive to or minimizes the effects of the inhomogeneity of the magnetic field in the second working volume by exciting and/or filtering nuclear spin transitions with energy differences independent of local variations of the strength of the magnetic field in the second working volume. In the second working volume, the homogeneity of the magnetic field is generally worse (e.g. by a factor of 100 or more) than the homogeneity of the magnetic field in the first working volume, in particular worse than the typical homogeneity level of high resolution NMR (which is at about 0.01 ppm or better). However, if the energy difference of the nuclear spin transitions of step c) in the sample at the second working volume does not depend on the local variations of the second field strength caused by its inhomogeneity, the nuclear spin transitions of the entire second working volume will contribute in a uniform manner to the NMR experiment. Accordingly, the inhomogeneity in the second working volume does not deteriorate the accuracy or precision of the NMR measurement. For example, a precision of chemical shift measurements of about 0.1 ppm could be achieved by the inventors in spite of a "residual" inhomogeneity of 10 ppm at the second working volume. Note that typical nuclear spin transitions for this variant are based on zero quantum coherences.

In a preferred variant, in step c), the RF and/or field gradient pulse sequence excites zero- or multiple-quantum coherences of nuclear spins of the sample in the second working volume. By this way, chemical shifts can be measured in the second working volume with a high precision, in particular a precision better than 0.5 ppm, even if the homogeneity of the magnetic field in the second working volume is relatively low, such as 2 ppm or worse. The inventive method can in particular be used to investigate two (or more) chemical shifts, in order to investigate the bondings of the nuclei measured. By two (or more) dimensions, spectra with easily resolvable maxima can be obtained. The interaction of the spins in the second working volume is different from the interaction in the first working volume, allowing access to additional information as compared to measurements based on the first working volume alone.

The use of zero-quantum coherences is a convenient way to cancel practically fully the effect of magnetic field inhomogeneities in the second working volume on measured line widths. If we define $B(x,y,z)$ as the magnetic field deviation from the average value $B_0$ in a point of coordinates x, y and z, then the precession frequency for a spin 1 is:

$$\Omega_1(x,y,z)=\Omega_1^0-\gamma_1 B(x,y,z)$$

For a spin 2, we have:

$$\Omega_2(x,y,z)=\Omega_2^0-\gamma_2 B(x,y,z)$$

where $\Omega_1^0$ is the precession frequency for spin 1 at the magnetic field $B_0$; $\Omega_2^0$ is the precession frequency for spin 2 at the magnetic field $B_0$; $\gamma_1$ is the gyromagnetic ratio of spin 1 and $\gamma_2$ is the gyromagnetic ratio of spin 2. The precession frequency of a zero-quantum coherence between spins 1 and 2, which necessarily belong to the same molecule (and thus have the same coordinates) is:

$$\Omega_1(x,y,z)-\Omega_2(x,y,z)=\Omega_1^0-\Omega_2^0-(\gamma_1-\gamma_2)B(x,y,z)$$

If spins 1 and 2 are of the same type, $\gamma_1=\gamma_2$ so that:

$$\Omega_1(x,y,z)-\Omega_2(x,y,z)=\Omega_1^0-\Omega_2^0$$

In other words, the precession frequency of the zero quantum coherence is independent of B(x,y,z). The effects of the magnetic field inhomogeneities are exactly canceled.

Note that multi-quantum coherences may be used in this variant, too, alternatively or in addition to zero quantum coherences. In particular, multi quantum coherences may be generated on a heteronuclear pair, such as on a 13C-1H pair. By converting zero quantum coherences and double quantum coherences with proper proportions, one can balance the effects of inhomogeneities for the "effective" CH zero quantum coherence and generate a two-field spectrum which reads as a 13C(low field)/1 H(high field) correlation.

In another advantageous variant, the steps a) through e) are repeated with the sample several times, for obtaining a multidimensional NMR measurement which displays at least one dimension based on the development and/or manipulation of nuclear spins of the sample in the second working volume and at least one dimension based on the development and/or manipulation of nuclear spins of the sample in the first working volume. By means of this multidimensional experiment (including a plurality of single measurements), additional spectroscopic information may be accessed. The two dimensions are based on a different physical behavior due to the different magnetic field strengths at the two working volumes, which typically result in different coupling properties and/or relaxation times.

In a preferred further development of this variant, in each step c), at least one time parameter of the sequence of RF and/or field gradient pulses is set to a different value. This particularly simple further development changes the time parameter belonging to the second field strength (or second working volume) from one repetition to a next one. A time parameter belonging to the first field strength (or first working volume) is fully varied through each repetition, what is very fast, since signal acquisition is also done at high field.

A preferred variant of the inventive method is characterized in that the 2FNMR measurement includes a two-field zero-quantum NMR spectroscopy experiment, with
  during step a), building-up and preparing polarization of nuclei of a specific type, in particular 13C nuclei,
  during step c), with a sequence of RF pulses, delays and field gradient pulses, generating and filtering zero-quantum coherences of a specific type, in particular between two 13C nuclei, and
  during step e) detecting single-quantum coherences. This experiment has been found useful in practice and is relatively easy to perform. With this variant, too, using the properties of zero-quantum coherences, the effects of the poorer homogeneity of the magnetic field of the second working volume may be cancelled or at least minimized in a simple way. For a general pulse sequence with selection of different multiple-quantum coherences, compare Bax A, Freeman R, Frenkiel T A, & Levitt M H (1981). *J. Magn. Reson.* 43(3):478-483. Further, for a single-field zero-quantum experiment, compare T. J. Norwood, *J. Magn. Reson., Ser A* 1993, 105, 193-203. In accordance with this variant, the zero quantum coherences in step c) may be between the nuclei of the specific type of step a), or between nuclei of a further (different) specific type, or between nuclei of the specific type of step a) and a further (different) specific type, or between nuclei of two further (different) specific types. Further, the single quantum coherences of step e) may be of any type, in particular between nuclei of the specific type of step a) and/or nuclei of a further specific type or further specific types of step c) and/or another specific type or other specific types of nuclei.

In an advantageous variant, the total duration of the transfer periods and the manipulation period is less than the spin-lattice relaxation time $T_1$ of the nuclear spins of the sample manipulated during step c) in the second working volume. This generally results in a good NMR signal strength.

Also advantageous is a variant wherein the first and the second transfer period have a duration of less than 100 ms each. This keeps loss of signal strength due to relaxation low.

Preferred is a variant wherein a sequence of RF pulses and/or field gradient pulses is applied to the sample during step a) in the first working volume. In this variant, a sample can be brought into a non-equilibrium initial state, which would not be accessible through simple exposure to a static field of the first working volume, or through spin manipulations in the second working volume. Note that alternatively, step a) may simply consist of exposing the sample to the magnetic field of the first field strength, in order to reach the equilibrium nuclear spin distribution in the sample at this field strength before step b) begins.

In an advantageous variant, step e) includes applying a single or a sequence of RF and/or field gradient pulses to the sample in the first working volume before starting NMR signal acquisition. This allows spin manipulation and orientation of the nuclear spins such that the first NMR probe may acquire (detect) the NMR signals in the desired way.

Another preferred variant provides that step c) is triggered by position sensors sensing the position of the sample at the second working volume, and/or that step e) is triggered by position sensors sensing the position of the sample at the first working volume. In this way, delays during transport can be detected and, if necessary, taken into account. If the sample does not arrive at a destined working volume at all, the measurement is typically stopped completely.

In another variant of the inventive method, NMR probes at the first and second working volume are synchronized. Thus fixed time correlations between the manipulations and/or developments of nuclear spins in the first and second working volume and further the NMR signal detection in the first working volume can be established, allowing particularly exact measurements.

Further preferred is a variant, wherein the preparation period of step a) is longer than a spin relaxation time T1 in the first working volume of the nuclear spins of the sample manipulated during step c). This ensures a high polarization level of the nuclear spins.

In another preferred variant, during step a) and/or step c) and/or step e), RF and/or field gradient pulses are applied to different types of nuclei of the sample, in particular wherein the nuclear spins of the different nuclei are manipulated at different working volumes. This allows the investigation of couplings of nuclear spins in different dimensions belonging to a different physical environment, giving particularly valuable information about the sample.

Further preferred is a variant wherein during step a) and/or step c) and/or step e), RF and/or field gradient pulses are applied only to nuclei of the sample which have an electric quadrupole moment of zero, in particular 1H, 13C and/or 15N. In this case, quadrupole effects do not interfere with the measurements, what makes data analysis particularly simple.

Another preferred variant provides that during step c) the pulse sequence performs a transfer of polarization in networks of nuclei through scalar coupling interactions or a transfer of polarization by isotropic mixing. Efficient isotropic mixing is obtained when the amplitude of the radiofrequency field is similar to the width of the spectrum that has to be covered for efficient isotropic mixing. Thus, efficient isotropic mixing over the complete carbon-13 spectrum (~200 ppm) at a field of 18.8 T would require a radiofrequency amplitude of about 40 kHz, which is impractical. On the other hand, efficient isotropic mixing over the complete carbon-13 spectrum (~200 ppm) at a lower field of 0.33 T requires a radiofrequency amplitude of about 700 Hz, which is readily accessible in most liquid-state probe designs. Thus, performing isotropic mixing at a lower field than the field used for chemical shift labeling has the advantage to be significantly more efficient over a much broader range of chemical shifts.

Further within the scope of the present invention is an apparatus for carrying out nuclear magnetic resonance measurements on a sample, the apparatus comprising:
- a magnet configuration for producing a magnetic field, with a homogeneity better than 0.01 ppm and a first field strength in a first working volume,
- said magnet configuration producing a stray field inducing a second field strength in a second working volume, in particular in a direction of an axis with a magnetic field gradient of first or higher order in said direction of said axis and wherein said axis extends through said second working volume,
- wherein said second field strength is 0.05 Tesla or larger, in particular 0.1 Tesla or larger;
- a first NMR probe equipped for sending RF and/or field gradient pulses into and detecting RF signals from the sample in said first working volume;
- a device for transferring the sample between said first working volume and said second working volume; and
- a device for homogenizing the magnetic field in said second working volume, characterized in that the apparatus further comprises a second NMR probe equipped for sending RF and/or field gradient pulses into the sample in said second working volume, that the device for homogenizing the magnetic field in said second working volume is designed for homogenizing the magnetic field to a homogeneity value of 100 ppm or better, in particular to a value between 2 ppm and 100 ppm, and that the first field strength is at least 2 Tesla larger than the second field strength.

The inventive apparatus is prepared for carrying out Two-Field Nuclear Magnetic Resonance (2FNMR) experiments, wherein nuclear spins may be exposed to and manipulated by means of RF pulses at two different magnetic field strengths. This allows obtaining additional spectroscopic information about the sample, in particular dynamic information or an additional measurement dimension which may be used to increase resolution, in particular to identify maxima in spectra more reliably.

At the first working volume equipped with the first NMR probe, a first field strength ("high field") with a high homogeneity is present, allowing in particular a strong initial polarization and a signal detection with high resolution and high sensitivity. Further, nuclear spin manipulations may be done at the first working volume.

At the second working volume equipped with the second NMR probe, a second field strength ("low field") with an at least fairly good homogeneity is present, which also allows nuclear spin manipulations, in particular band-selective manipulations of spins.

For numerous nuclear spin systems, the coupling properties and/or the relaxation times depend on the magnetic field strength present. Accordingly, since there are two different field strengths available in the inventive apparatus, the apparatus may perform experiments which make use of the different coupling properties and/or relaxation times in the same single measurement. This provides additional information about the sample in spectroscopy applications.

In particular, dynamic information (movement information) about nuclei in the sample or molecules containing said nuclei may be obtained.

In agreement with the invention, an additional dimension of NMR measurement of the sample becomes available. This additional dimension is based on a different second field strength and therefore on a different physical behavior, as compared to the physical behavior at the first field strength. In other words, the development of a spin system in the sample is different at the first and second field strength.

A typical multidimensional NMR experiment, in accordance with the invention, involves investigating at least one time parameter at low field, and at least one time parameter at high field. Typically, one time parameter at high field is fully varied in each single measurement, whereas one time parameter at low field is varied only from one single measurement to a next one.

The invention is particularly suitable for observing chemical shifts at two different fields in one experiment or a set of single measurements, respectively (with the chemical shifts representing the two dimensions of a measured 2-dimensional spectrum), in particular with the two chemical shifts belonging to different nuclei. The NMR active nuclei may be part of the same molecule (to investigate spin-spin coupling), or alternatively of different molecules (to investigate dipolar coupling).

It should also be mentioned that at lower field strengths, the split-up of energy levels of nuclear spins is less pronounced, what simplifies spin manipulations at lower field. Accordingly, the inventive apparatus may in particular be used to manipulate (and let develop) spins at low field, and to observe the NMR signal at high field (e.g. an FID signal).

The first and second NMR probe are tuned to one (or preferably several) NMR resonance lines of nuclei of the sample, such as the frequencies of 1H, 2H, 13C or 15N at the field strength of their respective working volume. The first NMR probe is for NMR signal excitation as well as NMR signal detection. The second NMR probe is used for NMR signal excitation, and may also be used for NMR signal detection. It should be noted that the interaction of the two magnetic fields of different strengths with the nuclei may include relaxation processes and/or induced coherent processes in each case.

The magnet configuration typically comprises at least one superconducting magnet coil in a cryostat. The required homogeneity of the respective working volumes is present at least in the space taken by the sample. Since the stray field of the magnet configuration is used to provide the second working volume with the second field strength, the design of the apparatus is particularly simple and cost-efficient. In accordance with the invention, the first and second field strength differ at least by 2 Tesla, preferably at least by 4 Tesla, and may be chosen to be different at least by a factor of 3, in order to establish a significantly different behavior of spins at the two field strengths.

An inventive apparatus described above or one of its embodiments described below may be used for performing an inventive method or one of its variants described above.

Preferred is an embodiment of the inventive apparatus, wherein the first field strength is at least 9 Tesla, preferably at least 14 Tesla. This allows high polarization levels of nuclear spins, and high spectral resolution. The second field strength is typically between 0.05 Tesla and 7 Tesla, and often between 0.1 Tesla and 5 Tesla.

In a particularly preferred embodiment, the apparatus comprises at least one
- further working volume, with the stray field inducing a further field strength in said further working volume, in particular in a direction of an axis with a magnetic field gradient of first or higher order in said direction of said axis and wherein said axis extends through said further working volume,
- further NMR probe equipped for sending RF and/or field gradient pulses into the sample in said further working volume, and
- further device for homogenizing the magnetic field in said further working volume to a value of 100 ppm or better, in particular to a value between 2 ppm and 100 ppm, wherein the first, second, and at least one further field strength are different form each other, and wherein the device for transferring the sample may transfer the sample between the first, second, and at least one further working volume. The at least one further working volume, NMR probe and device for homogenization allows at least one further dimension with physically different spin behavior for multidimensional (namely at least 3-dimensional) NMR measurements, allowing to retrieve even more information on the sample. The further field strength is typically also 0.05 Tesla or larger, preferably 0.1 Tesla or larger.

In a preferred embodiment of the inventive apparatus, the apparatus comprises a cryostat with a room temperature bore, and the working volumes are located within the room temperature bore. This allows particularly short transport distances between the first and second (and if applicable further) working volumes, and allows to shield the magnet configuration beyond the second (and if applicable further) working volume in a simple way.

In an advantageous embodiment, the device for transferring the sample has a tubular shape and comprises means for applying gas pressure to both ends of the tube. A (straight) tubular shape allows a coaxial arrangement of the working volumes, what simplifies field homogenization, in particular when the device for transporting is arranged along the magnet axis of the magnet configuration. The gas pressure mechanism hardly interferes with NMR measurements.

Also preferred is an embodiment wherein the device for transferring the sample between said working volumes comprises position sensors indicating the position of the sample. This allows triggering, in particular prompt triggering, of spin manipulations and/or measurements. Further, the position sensors may verify whether the sample is present at any one of the working volumes.

In an advantageous embodiment, the device for transferring the sample is temperature stabilized by means of a temperature-controlled gas flow. In this way, corruption of measurements by temperature changes affecting the sample can be minimized.

Further advantageous is an embodiment wherein the device for transferring the sample comprises a shock damping system. This avoids sample damaging and introduction of vibration into the apparatus upon change of the sample position.

In another preferred embodiment, the device for homogenizing comprises ferroshims located in a room-temperature or a cryostatic part of the apparatus.

Ferroshims are inexpensive and easy to handle; in particular they do not need electronic control systems. Positioning in the room temperature part (such as the bore) simplifies installation and repair, whereas positioning in a cryostatic part reduces temperature variations on the ferroshims and thus allows more stable measuring conditions.

In an advantageous embodiment, the device for homogenizing comprises at least one superconducting coil located in a cryostatic part of the apparatus with an adjustable magnetic field strength. This allows to compensate for even a strong gradient of the stray field without difficulty, and for adaptions (corrections) of the compensating gradient field strength during use. Preferably, the at least one superconducting coil may, to some extent, also adjust the second field strength, e.g. by up to 20% as compared to the second field strength with a currentless, at least one superconducting coil.

Further preferred is an embodiment wherein the first NMR probe and/or the second NMR probe are multiple-resonance NMR probes, in particular triple-resonance NMR probes. This allows manipulating and/or measurement of multiple nuclei in the sample, in particular to investigate nuclear coupling, or to be more flexible with respect to samples to be investigated.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawings.

DESCRIPTION OF THE PREFERRED EMBODIMENT

The present invention relates to high-resolution two-field nuclear magnetic resonance spectroscopy.

Nuclear magnetic resonance (NMR) is a unique spectroscopic technique to characterize the properties of matter in exquisite detail at atomic resolution. Over decades of methodological developments, many NMR experiments have been proposed to probe physical and chemical properties at a particular magnetic field and observe the NMR signals at a different field. Here, the inventors introduce a two-field NMR spectrometer that permits the manipulation of spin systems and the observation of signals at two magnetic fields. Coupled with a fast pneumatic shuttling system, the two-field spectrometer permits the acquisition of two-dimensional spectra where the indirect and direct dimensions are acquired at different magnetic fields. In spite of the moderate field inhomogeneity of the low-field center, the inventors introduce a zero-quantum 2D experiment that offers high-resolution in both chemical shift dimensions.

The ability of nuclear magnetic resonance (=NMR) to probe the chemical and physical properties of matter at atomic resolution makes it a ubiquitous spectroscopic tool in molecular chemistry, material science, structural biology and medicine. Such achievements were made possible by the enhanced resolution offered by the introduction of two-dimensional NMR and subsequent multi-dimensional experiments. Magnetic-field dependent properties have been probed with many techniques that explore two (or more) magnetic fields over the course of a single experiment. Fast field-cycling relaxometry, zero-field NMR and dynamic nuclear polarization, among others take great benefit from such schemes. However, no experiment has been proposed so far where chemical shifts are recorded at two different fields. The availability of very high magnetic fields (1 GHz and above) challenges the usual rule that higher fields are necessarily better for all spin systems (e.g. carbonyl carbon-13 relaxation due to the chemical shift anisotropy becomes a major limitation at such fields). Most multi-dimensional NMR experiments include chemical shift evolution delays that differ in the optimal magnetic field at which they should be recorded. Such optimal magnetic fields can be extremely high (e.g. to reduce effects of second order quadrupolar couplings), but some optimal magnetic fields are nowadays accessible (i.e. close to 14.1 T for carbonyl single-quantum evolution in a large protein or 1 GHz for TROSY).

Here, by way of example a two-field NMR spectrometer is introduced, in which a low magnetic field center, including a homogeneous magnetic field, a triple-resonance probe with single-axis gradient is installed in the stray field of a commercial 14.1 T (600 MHz) spectrometer. Transfer between the two fields is possible with the use of a pneumatic sample shuttle system. In the following, this system is briefly described, and by way of example a series of two-field NMR experiments is introduced, including a two-field heteronuclear single-quantum coherence (2F-HSQC) experiment as well as a two-field zero-quantum/single quantum correlation experiment (two-field zero-quantum NMR spectroscopy) that provides high-resolution spectra in both dimensions.

Two-Field NMR Spectrometer

The two-field NMR spectrometer with which the experimental results described below were obtained is designed from a commercial NMR spectrometer (here operating at 14.1 T, 600 MHz proton resonance frequency) augmented by a series of accessories: a ferroshim system designed to obtain an homogeneous magnetic field (at 0.33 T) in the stray field of the 14.1 T superconducting magnet; a low-field triple resonance probe equipped with a single-axis gradient; a system to generate and amplify radiofrequency pulses at low frequency; and a pneumatic sample shuttle used to ensure fast transfer between the two magnetic centers. Here follows a brief description of each element.

Ferroshims:

The ferroshim system includes pieces of iron placed around the second magnetic center. This design used is based on U.S. Pat. No. 8,154,292 B2, but is refined with the use of ferroshim foils and a dedicated temperature regulation. A set of room temperature shim coils increases the homogeneity of the magnetic field in the second magnetic center. The distribution of magnetic fields in the active volume of the low-field center can be evaluated from a proton spectrum: full width at half height is usually close to 10 ppm (see below).

Low-Field Probe:

This triple resonance probe consists of two coils: the inner coil has a three winding saddle coil geometry and is optimized for the proton frequency (14 MHz). The outer coil has a seven winding saddle coil geometry and is optimized for carbon-13 (3.52 MHz) and nitrogen-15 (1.42 MHz). In addition, this probe is equipped with a coil for z-axis pulse field gradients.

Low-Field Spectrometer:

Current Advance NMR spectrometers can operate down to a frequency of 6 MHz. A new low-frequency signal-generating unit was developed to enable the generation of radiofrequency (RF) pulses with defined frequencies, phases and amplitude profiles below 6 MHz. Two low-frequency 200 W amplifiers are used for RF amplification. The six-channel spectrometer allows for the combination of up to three channels at both high and low field (e.g. $^1H$, $^{13}C$, $^{15}N$) or four channels at high field ($^1H$, $^{13}C$, $^2H$, $^{15}N$) and two channels at low field (e.g. $^1H$, $^{13}C$ or $^1H$, $^{15}N$).

Sample Shuttle:

The sample shuttle is based on a pneumatic transport mechanism described by Charlier C, et al. (2013) Nanosecond Time Scale Motions in Proteins Revealed by High-Resolution NMR Relaxometry. *J Am Chem Soc* 135(49): 18665-18672. A shuttle guide (i.e. the tube that contains the moving sample shuttle) was designed to fit tightly between the high-field and the low-field probes.

Radiofrequency Pulses at Low Field.

Nutation experiments have been performed for each nucleus ($^1H$, $^{13}C$, $^{15}N$) in order to calibrate the amplitude of radiofrequency pulses at low field and characterize the homogeneity of RF fields. For enhanced sensitivity, the polarization builds up during the recovery delay at high field, the sample shuttle is then moved to the low field position ($B_{low}$=0.33 T) and a single pulse is applied. Coherences are suppressed by the strong gradient during the transfer to the high-field spot ($B_{high}$=14.1 T). The acquisition follows a 90° pulse at high field.

Figure 1:
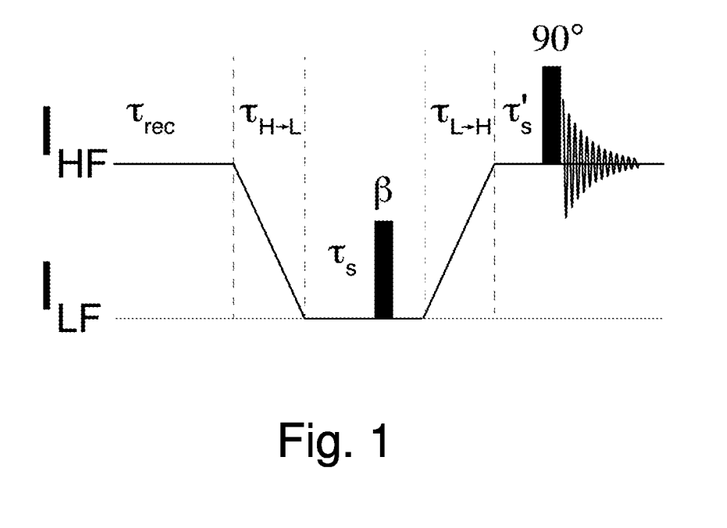
FIG. 1 shows a pulse sequence used to calibrate I=1 H, 13C and 15N pulse lengths at low field.

FIG. 1 shows a pulse sequence used to calibrate I=$^1H$, $^{13}C$ and $^{15}N$ pulse lengths at low field. The first filled rectangle represents the variable pulse at low field (LF) with a nutation angle β, and the second one is a 90° pulse at high field (HF). $\tau_{rec}$ was between 2 and 10 s, depending on the nucleus. $\tau_{H-L}$ was ~100 ms, and to $\tau_{L-H}$=~100 ms. $\tau_s$=300 ms and $\tau'_s$=200 ms are stabilization delays.

These experiments have been performed on two samples: 4 M $^{13}C$ and $^{15}N$ labelled urea in 90% $D_2O$ and 1 M $^{13}C$ and $^{15}N$ labelled urea in 100% $D_2O$. Results of these calibrations are shown in Table 1. Nutation profiles are available for each nucleus in the supplementary information. High power pulses, with amplitudes ranging from 12.5 to 25 kHz make highly broadband pulses readily accessible at low magnetic fields.

TABLE 1

| Channel | Power | 90 degree pulse |
|---|---|---|
| H-1 | 0.5 W | 10.2 μs |
| C-13 | 100 W | 11.1 μs |
| N-15 | 50 W | 20 μs |

Table 1 describes the calibration of radiofrequency pulses at 0.33 T with polarization and acquisition at high field.

Figure 2:
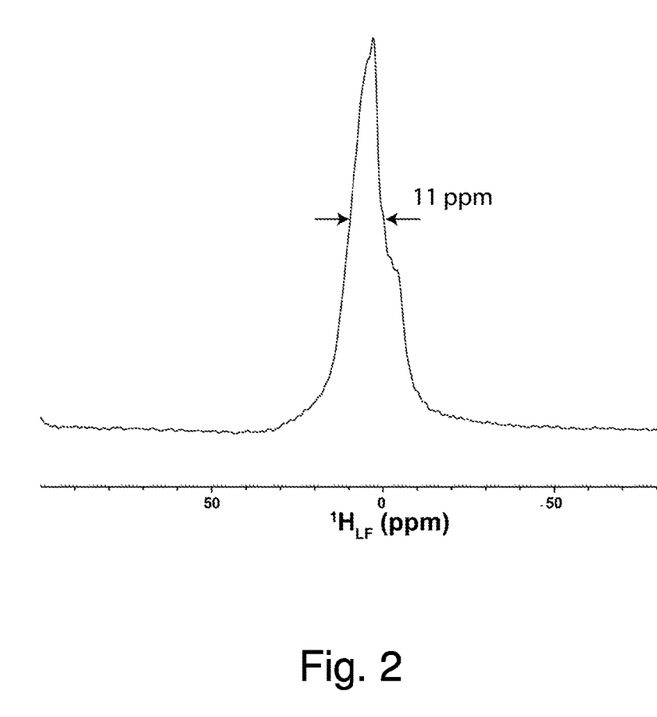
FIG. 2 shows a 1-Dimensional 1H spectrum measured at 0.33 T on a sample of 1 M glycine in $D_2O$.

FIG. 2 shows an 1D $^1$H spectrum measured at 0.33 T on the sample of 1 M glycine in $D_2O$.

FIG. 2 displays a typical 1D proton spectrum measured at low field, with polarization at high field. The magnetic field homogeneity is not sufficient to obtain proton high-resolution spectra. However, it is sufficient to ensure that broadband radiofrequency pulses can be used on all nuclei.

Two-Field-HSQC.

Figure 3:
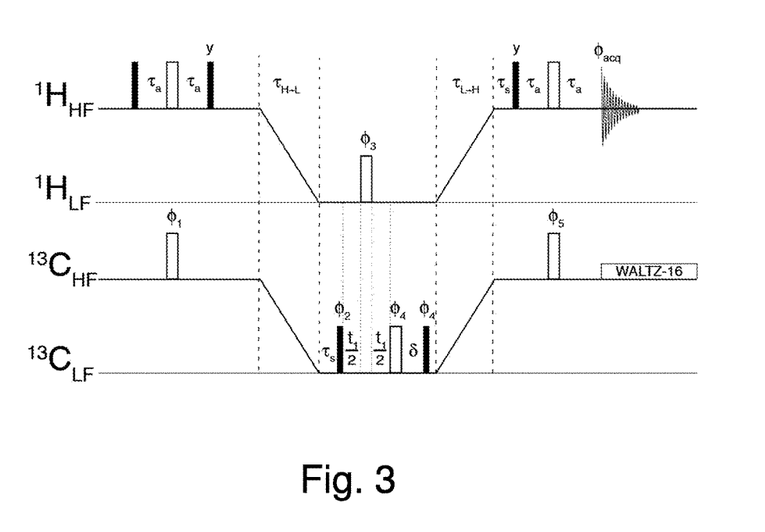
FIG. 3 shows a pulse sequence of a two field heteronuclear single quantum coherence experiment (2F-HSQC), in accordance with the invention.

The two-field heteronuclear single quantum coherence experiment (2F-HSQC) was first run to demonstrate the principle of two-field NMR spectroscopy. The original HSQC experiment was modified to provide a correlation between carbon-13 nuclei at low field and protons at high field. The pulse program is shown in FIG. 3. The shuttle transfer occurs before the first 90° pulse on carbon-13 in the INEPT sequence, with the polarization stored as a $C_zH_z$ term. An antiphase coherence on carbon evolves under the chemical shift, magnetic fields inhomogenities and homonuclear couplings at low fields, while the scalar coupling with protons is refocused by a 180° pulse on the proton channel. Polarization is stored again as a $C_zH_z$ term for the transfer back to high fields for detection on the high-field proton channel.

FIG. 3 shows a pulse sequence of the 2F-HSQC ($^1H_{HF}$, $^{13}C_{LF}$) experiment. All narrow (filled) and open (wide) rectangles represent 90° and 180° pulses, respectively. Pulse phases are along the x-axis of the rotating frame unless otherwise mentioned. $\tau_a=1/(4J_{CH})=1.7$ ms; δ is chosen to obtain a perfect echo on the carbon-13 at low field for the first increment of $\tau_1$; $\tau_{H-L}=\sim100$ ms and $\tau_{L-H}=\sim100$ ms. The stabilization delay $\tau_s=200$ ms allows for convection currents and vibrations to settle. Composite pulse decoupling was performed with a WALTZ-16 scheme and RF amplitudes of 1 kHz on the carbon channel. The phase cycles were: $\phi_1=\{x, x, x, x, x, x, x, x, -x, -x, -x, -x, -x, -x, -x, -x\}$; $\phi_2=\{x, -x\}$; $\phi_3=\{x, x, -x, -x\}$; $\phi_4=\{x, x, x, x, -x, -x, -x, -x\}$; $\phi_5=\{x, x, x, x, x, x, x, x, -x, -x, -x, -x, -x, -x, -x, -x\}$, $\phi_{acq}=\{x, -x, -x, x, y, -y, -y, y\}$.

The 2F-HSQC experiment was performed on a 1 M carbon-13 and nitrogen-15 labelled sample of glycine. This 2F-HSQC spectrum is shown on FIG. 4. As in the proton one-dimensional spectrum (see FIG. 2), the line width is dominated by magnetic field inhomogeneities. However, the doublet due to the one-bond scalar coupling of the alpha carbon-13 of glycine with the carboxyl carbon-13 is partially resolved. This coupling is 55 Hz, or 16 ppm for carbon-13 at 0.33 T.

Figure 4:
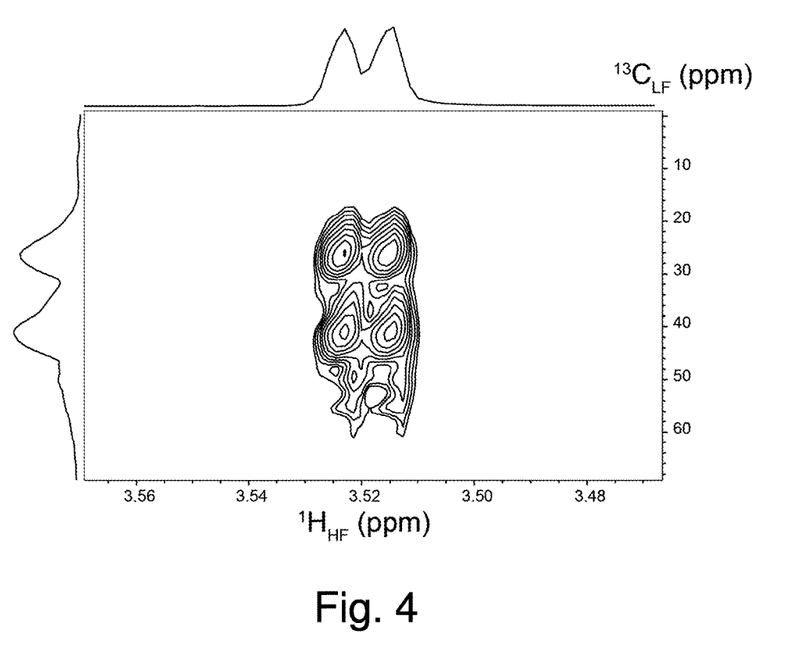
FIG. 4 shows a HSQC 1H/13C spectrum of 1 M Glycine (13C and 15N labelled), in accordance with the invention.

FIG. 4 shows a HSQC $^1H_{HF}/^{13}C_{LF}$ spectrum of 1 M Glycine ($^{13}$C and $^{15}$N labelled).

Two-Field Zero-Quantum NMR Spectroscopy.

In order to reduce the contribution of magnetic field inhomogeneities to the line width at low field, a correlation experiment between single-quantum coherences at high field and zero-quantum coherences at low field was implemented. Zero- and multiple-quantum coherences have been used for many years to obtain high-resolution spectra in inhomogeneous magnetic fields. Here, the inventors introduce a two-field zero-quantum NMR spectroscopy sequence, which was adapted from a refocused INADEQUATE experiment.

The two-field zero-quantum NMR spectroscopy pulse sequence, shown in FIG. 5, corresponds closely to the gradient-selected refocused INADEQUATE experiment and only differences will be discussed. Most of the pulse sequence takes place at low field, in order to reduce off-resonance effects of carbon-13 pulses. A band-selective 180° pulse is applied to invert carbonyl/carboxyl carbon-13 polarization at the start of the sequence at high field in order to maximize the polarization of the zero-quantum coherence. The shuttle transfer to low field occurs with carbon-13 longitudinal polarizations. A bipolar pulsed-field gradient is applied at low field after the ti chemical-shift labelling period to select zero-quantum coherences and populations. After the refocusing element, a 90° pulse on carbon-13 brings back polarizations along the z-axis for storage during the shuttle transfer to high fields. At high field, a carbon-13 90° pulse is followed by the signal detection. Proton composite pulse decoupling is applied during the whole experiment except when the sample is outside of either probe (i.e. during shuttle transfers) for both decoupling and carbon-13 polarization enhancement by nuclear Overhauser effects. A single 180° pulse is applied on the nitrogen-15 channel during the $\tau_1$ delay. Frequency sign discrimination in the indirect dimension was performed with a TPPI scheme.

Figure 5:
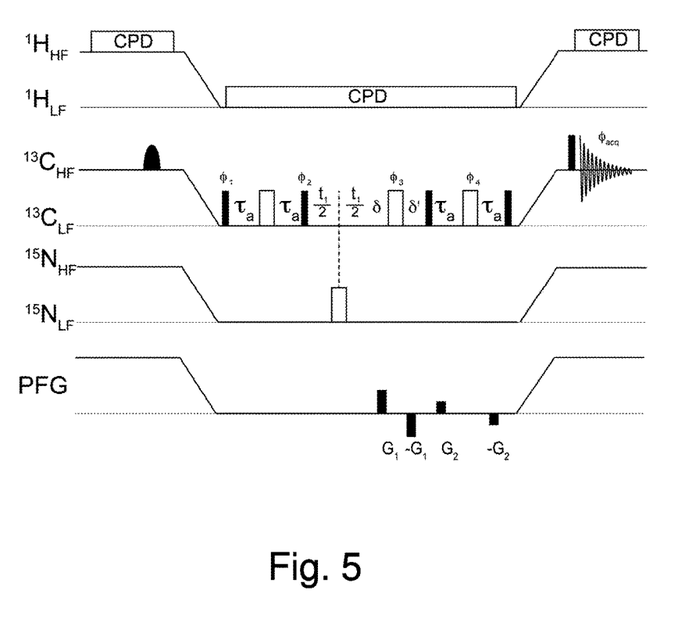
FIG. 5 shows a two-field zero-quantum NMR spectroscopy pulse sequence, in accordance with the invention.

FIG. 5 shows the two-field zero-quantum NMR spectroscopy pulse sequence. Narrow black and wide open rectangles represent 90° and 180° pulses, respectively. Pulses are applied along the x-axis of the rotating frame unless otherwise indicated. The bell-shaped pulse on the high-field carbon-13 channel is a 44 ms rectangular inversion pulse that leaves carboxyl carbon-13 unperturbed. The delay $\tau_a=1/4J_{CC}=1.7$ ms. Composite pulse decoupling was performed with a WALTZ-16 scheme and RF amplitudes of 1 kHz on both the HF and LF proton channels. Gradient pulses were applied along the z-axis and had durations of 1 ms and amplitudes: $G_1=20\%$ and $G_2=0\%$ of the maximum amplitude. In the 2F-INADEQUATE variant, $G_2=40\%$ of the maximum amplitude, and the initial band-selective inversion pulse was omitted. The phase cycle is: $\phi_1=x, -x$; $\phi_2=x$; $\phi_3=-x, -x, x, x$; $\phi_4=-x, -x, -x, -x, x, x, x, x$; $\phi_{acq}=x, -x$. Frequency sign discrimination in the indirect dimension was performed with a TPPI scheme applied on $\phi_2$.

Figure 6:
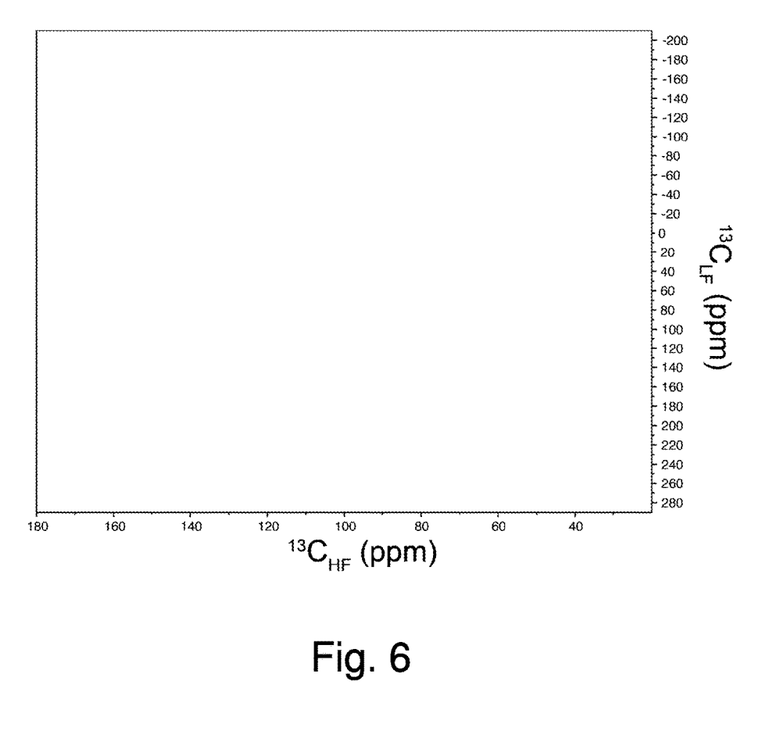
FIG. 6 shows two-field zero-quantum NMR spectroscopy 2D $13C_{HF}/13C_{LF}$ spectra of an 1 M glycine sample, in accordance with the invention.

FIG. 6 shows the two-field zero-quantum NMR spectroscopy 2D $^{13}C_{HF}/^{13}C_{LF}$ spectra of a 1M glycine sample.

The two-field zero-quantum NMR spectroscopy experiment was performed on a 1 M glycine ($^{13}$C and $^{15}$N labelled) sample. Results are show in FIG. 6 and FIG. 7. Due to the evolution on the zero quantum coherence, the effects of magnetic field inhomogeneities at low field are suppressed in the indirect dimension. A narrow signal can be observed in FIG. 6 at 158 ppm, that is 132 ppm from the maximum frequency (which is at 280 ppm) in the indirect dimension. Zero-quantum coherences are immune to the TPPI shift of frequencies in the indirect dimension, so that resonance frequencies should be measured from the edge and not the center of the spectrum. This zero-quantum chemical shift is then equal to the expected zero-quantum chemical shift of 132 ppm. The broad spectral window used in FIG. 6 precludes the observation of the natural line width in a reasonable experimental time. A two-field zero-quantum NMR spectroscopy spectrum, highly folded in the indirect dimension (with a 10 ppm spectral window), was recorded and is shown on FIG. 7. The line width is dramatically reduced in the indirect dimension, with a full width at half height equal to 0.17 ppm, or 0.6 Hz. This is about two orders of magnitude narrower than single quantum lines, measured in simple one-dimensional spectra (FIG. 2) or in two-dimensional correlations (FIG. 4).

Figure 7:
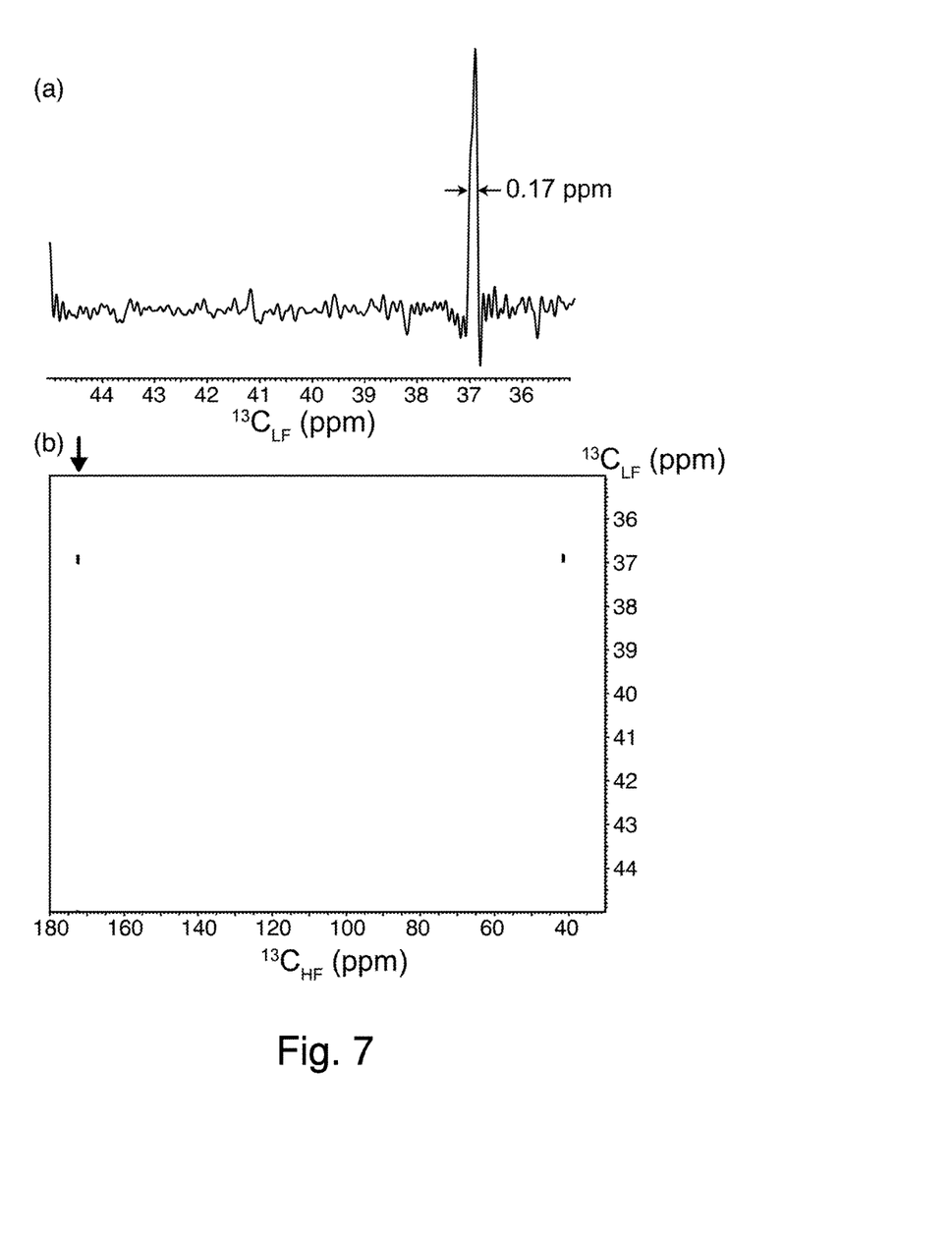
FIG. 7 shows highly folded two-field zero-quantum NMR spectroscopy 2D $13C_{HF}/13C_{LF}$ spectra of an 1 M glycine sample, in accordance with the invention, with (a) 1D $13C_{LF}$ spectrum extracted at $\delta(13C_{HF})$=172.267 ppm; and (b) 2D two-field zero-quantum NMR spectroscopy spectrum, with spectral window in the indirect dimension reduced to 10 ppm.

FIG. 7 shows highly folded two-field zero-quantum NMR spectroscopy 2D $^{13}C_{HF}/^{13}C_{LF}$ spectra of a 1M glycine sample. (a) One dimensional $^{13}C_{LF}$ spectrum extracted from the 2D two-field zero-quantum NMR spectrum at $\delta(^{13}C_{HF})$=172.267 ppm. (b) 2D two-field zero-quantum NMR spectrum, the spectral window in the indirect dimension was reduced to 10 ppm in order to reach the full natural resolution of the experiment. No apodization function was used in the indirect dimension.

A two-field NMR spectrometer is presented by way of example, where one magnetic field center is generated by a commercial superconducting magnet, while the second magnetic center is an engineered plateau of magnetic field in the stray field of the superconducting magnet. Both magnetic centers are equipped with triple-resonance and single-axis gradient probes. A six-channel NMR console is used for radiofrequency pulse generation and fast motion between the two magnetic centers is achieved with a pneumatic shuttle device. Two-field pulse sequence programming is conveniently integrated so that most high-resolution techniques can be adapted on this system. Pulse sequences are introduced where RF pulses and evolutions under chemical shifts are performed at either of the two fields. In particular a 2F-HSQC sequence allows for the measurement of correlation spectra where the direct and indirect dimensions are recorded at two distinct magnetic fields. In the two-field zero-quantum NMR spectroscopy experiment, a zero-quantum chemical shift evolution takes place at low field and suppresses the effects of the moderate magnetic field inhomogeneity of the low-field center. The resulting two-field NMR spectra display high resolution in both dimensions. This opens the way to the development of a new library of pulse sequences designed, in particular, to observe chemical shift evolutions at the most relevant frequency for each different nucleus.

Figure 8:
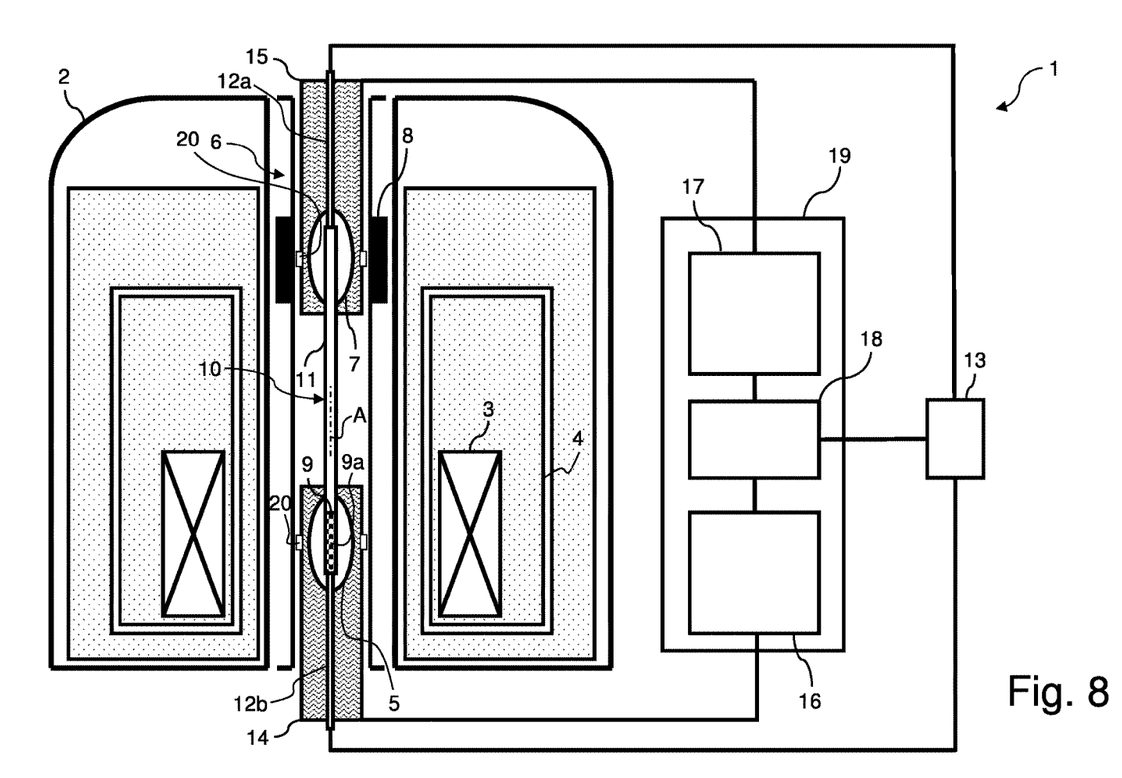
FIG. 8 a schematic cross section of an inventive apparatus for carrying out a 2FNMR measurements on a sample, in accordance with the invention.

FIG. 8 shows an apparatus 1 for carrying out an inventive 2FNMR method.

The apparatus 1 comprises a cryostat 2 containing a magnet configuration 3. The magnet configuration 3 comprises superconducting coil sections (not shown) cooled by liquid helium in a tank 4.

The magnet configuration 3 generates a magnetic field in a first working volume 5 inside a room temperature bore 6 of the cryostat 2; the first working volume 5 surrounds the magnetic center of the magnet configuration 3. The magnetic field within the first working volume 5 has a homogeneity better (lower) than 0.01 ppm, for example 0.005 ppm. The homogeneity is typically achieved by means of a suitable design of the magnet configuration 3 and a shim coil system (not shown). In the example shown, a first field strength of the magnetic field ($B_0$ field), which is oriented parallel to the magnetic axis A, is about 14 Tesla in the first working volume 5.

The stray field of the magnet configuration 3 further generates a magnetic field at a second working volume 7, also within the room temperature bore 6. The stray field alone would exhibit a significant magnetic field gradient along the magnetic axis A within the second working volume 7. In order to obtain a magnetic field within the second working volume 7 with a homogeneity of 100 ppm or better (lower), for example of 50 ppm, the apparatus 1 comprises a device 8 for homogenizing the magnetic field, which is here designed as a system of ferroshims located in the room temperature bore 6. The ferroshims surround the second working volume 7 here. In the example shown, a second field strength of the magnetic field ($B_0$ field), which is again oriented parallel to the magnetic axis A, is about 0.3 Tesla in the second working volume 7.

A sample carrier 9 carrying a sample 9a to be investigated may be transported between the first working volume 5 and the second working volume 7 by means of a for transporting the sample 9a. The device 10 for transporting the sample 9a here comprises a straight tubular guide 11 in which the sample carrier 9 may move, and further two pieces of auxiliary tubing 12a, 12b for applying gas pressure at the opposing ends of the tubular guide 11. By means pressure differences between the ends of the tubular guide 11, the sample carrier 9 may be accelerated within the tubular guide 11. The gas pressure is controlled via shuttle controller 13. By means of position sensors 20, an arrival of the sample carrier 9 at a desired working volume 5, 7 may be verified.

The first working volume 5 is surrounded by a first NMR probe 14, and the second working volume 7 is surrounded by a second NMR probe 15. In the shown example, the first NMR probe 14 is connected to a first NMR signal excitation and detection hardware 16, and the second NMR probe 15 is connected to a second signal excitation and detection hardware 17. Hardware 16 and hardware 17 are connected to an NMR timing device 18. Here, each of the two NMR probes 14, 15 may be used for both sending RF and/or gradient pulses into the sample 9a at their respective working volume 5, 7, and for detecting RF signals form the sample 9a in their respective working volume 5, 7. Hardware 16, hardware 17 and the NMR timing device 18 belong to an NMR console 19.

By means of the apparatus 1, a sample 9a may be located, manipulated with RF and field gradient pulses, and measured at both working volumes 5, 7. The working volumes 5, 7 have magnetic field strengths with a significantly different absolute value, namely with a difference of at least 2 Tesla, to allow a physically different behavior of the sample 9a at the different working volumes 5, 7. The device 10 for transferring the sample 9a allows a quick change between the working volumes 5, 7, in particular such that a typical NMR signal decay during a change is negligible (such as with less than 10% signal loss during a change).

We claim:

1. A method for carrying out two-field nuclear magnetic resonance (=2FNMR) measurements on a sample, the method comprising the steps of:
   a) preparing the sample during a preparation period in a first working volume of a first magnetic field with a first field strength and having a homogeneity better than 0.01 ppm;
   b) transferring, during a first transfer period, the sample to a second working volume with a second magnetic field having a homogeneity of 100 ppm or better or in a range between 2 ppm and 100 ppm, and having a second field strength of 0.05 Tesla or larger or of 0.1 Tesla or larger, wherein the first field strength is at least 2 Tesla larger than the second field strength;
   c) manipulating, during a manipulation period, the sample at the second working volume by applying a sequence of radio-frequency (=RF) and/or field gradient pulses, wherein the sequence is insensitive to or minimizes effects of an inhomogeneity of the second magnetic field in the second working volume;
   d) transferring the sample back to the first working volume during a second transfer period; and
   e) detecting an NMR signal of the sample in the first working volume.

2. The method of claim 1, wherein in step c), the RF and/or field gradient pulse sequence is insensitive to or minimizes the effects of the inhomogeneity of the magnetic field in the second working volume by exciting and/or filtering nuclear spin transitions with energy differences independent of local variations of a strength of the magnetic field in the second working volume.

3. The method of claim 1, wherein in step c), the RF and/or field gradient pulse sequence excites zero- or multiple-quantum coherences of nuclear spins of the sample in the second working volume.

4. The method of claim 1, wherein the steps a) through e) are repeated with the sample several times, for obtaining a multidimensional NMR measurement which displays at least one dimension based on a development and/or manipulation of nuclear spins of the sample in the second working volume and at least one dimension based on a development and/or manipulation of nuclear spins of the sample in the first working volume.

5. The method of claim 4, wherein, in each step c), at least one time parameter of the sequence of RF and/or field gradient pulses is set to a different value.

6. The method of claim 1, wherein the 2FNMR measurement includes a two-field zero-quantum NMR spectroscopy experiment, with building-up and preparing polarization of nuclei of a specific type during step a), with a sequence of RF pulses, delays and field gradient pulses generating and filtering zero-quantum coherences of a specific type during step c), and with detecting single-quantum coherences during step e).

7. The method of claim 6, wherein the nuclei of a specific type comprises 13C nuclei.

8. The method of claim 1, wherein a total duration of the first and second transfer periods and the manipulation period is less than a spin-lattice relaxation time of nuclear spins of the sample manipulated in the second working volume during step c).

9. The method of claim 1, wherein the first and the second transfer period each have a duration of less than 100 ms.

10. The method of claim 1, wherein a sequence of RF and/or field gradient pulses is applied to the sample in the first working volume during step a).

11. The method of claim 1, wherein step e) includes applying a single or a sequence of RF and/or field gradient pulses to the sample in the first working volume before starting NMR signal acquisition.

12. The method of claim 1, wherein step c) is triggered by position sensors sensing a position of the sample in the second working volume and/or that step e) is triggered by position sensors sensing a position of the sample in the first working volume.

13. The method of claim 1, wherein NMR probes at the first and second working volume are synchronized.

14. The method of claim 1, wherein the preparation period of step a) is longer than a spin relaxation time in the first working volume of the nuclear spins of the sample manipulated during step c).

15. The method of claim 1, wherein, during step a) and/or step c) and/or step e), RF and/or field gradient pulses are applied to different types of nuclei of the sample.

16. The method of claim 15, wherein nuclear spins of the different nuclei are manipulated at different working volumes.

17. The method of claim 1, wherein, during step a) and/or step c) and/or step e), RF and/or field gradient pulses are applied only to nuclei of the sample which have an electric quadrupole moment of zero.

18. The method of claim 17, wherein the nuclei of the sample are 1 H, 13C and/or 15N.

19. The method of claim 1, wherein during step c), a pulse sequence performs a transfer of polarization in networks of nuclei through scalar coupling interactions or a transfer of polarization by isotropic mixing.

* * * * *

UNITED STATES PATENT AND TRADEMARK OFFICE
CERTIFICATE OF CORRECTION

PATENT NO. : 10,371,774 B2
APPLICATION NO. : 15/096287
DATED : August 6, 2019
INVENTOR(S) : S. Cousin et al.

Page 1 of 1

It is certified that error appears in the above-identified patent and that said Letters Patent is hereby corrected as shown below:

On the Title Page

Correct the addresses of the fourth and fifth inventors as follows:
-- Jean-Max Tyburn, Wissembourg (FR)
Thorsten Marquardsen, Karlsruhe (DE) --.

Signed and Sealed this
Twelfth Day of November, 2019

Andrei Iancu
*Director of the United States Patent and Trademark Office*